United States Patent [19]

Fok

[11] Patent Number: 4,688,016

[45] Date of Patent: Aug. 18, 1987

[54] BYTE-WIDE ENCODER AND DECODER SYSTEM FOR RLL (1,7) CODE

[75] Inventor: Wilson W. Fok, San Jose, Calif.

[73] Assignee: International Business Machines Corporation, Armonk, N.Y.

[21] Appl. No.: 745,242

[22] Filed: Jun. 13, 1985

[51] Int. Cl.[4] .............................................. H03M 7/28
[52] U.S. Cl. ............................... 340/347 DD; 360/39; 360/40
[58] Field of Search ............ 340/347 DD; 360/39–42; 235/310–311

[56] References Cited

U.S. PATENT DOCUMENTS

| | | | |
|---|---|---|---|
| 3,685,033 | 8/1972 | Srivastava et al. | 340/174.1 |
| 4,115,768 | 9/1978 | Eggenberger et al. | 340/347 |
| 4,337,458 | 6/1982 | Cohn et al. | 340/347 DD |
| 4,413,251 | 11/1983 | Adler et al. | 340/347 |
| 4,488,142 | 12/1984 | Franaszek | 340/347 DD |

Primary Examiner—T. J. Sloyan
Attorney, Agent, or Firm—Brown, Martin, Haller & Meador

[57] ABSTRACT

A system for encoding consecutive parallel bytes of source data into an RLL (1,7) output symbol string and decoding an input RLL (1,7) symbol string to produce an output sequence of parallel bytes of data. The system accepts an input sequence of parallel data bytes occurring at a byte rate and provides, in response, the output RLL symbol string at a symbol string rate which is twelve times the byte rate. Similarly, the output byte sequence has a byte rate which is 1/12 of the input RLL symbol string rate. The system performs RLL encoding and decoding at the byte rate, thus eliminating the odd $\frac{2}{3} f_C$ source clock required in systems performing RLL coding and decoding functions on a bit-by-bit basis.

13 Claims, 8 Drawing Figures

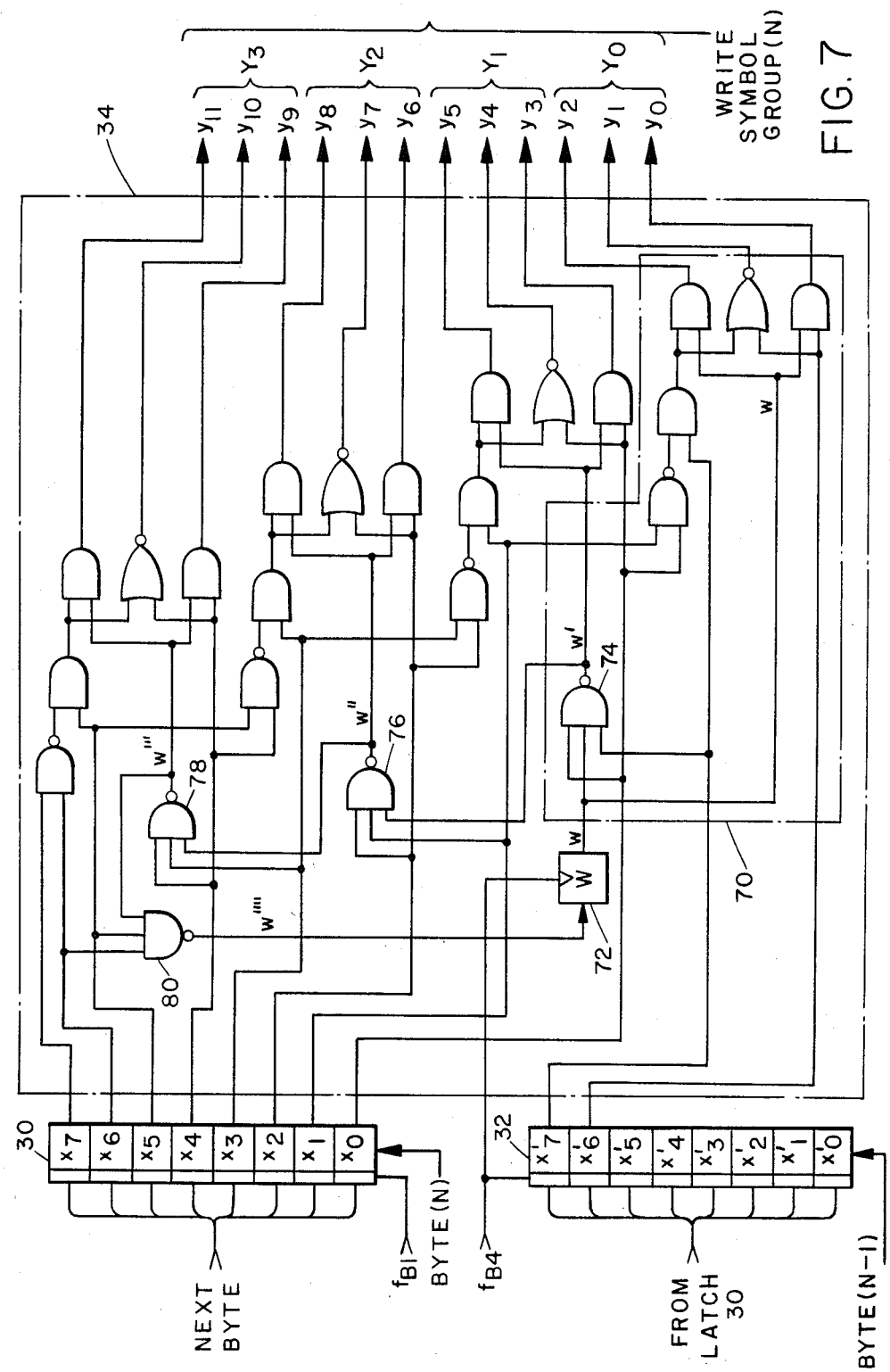

BYTE-WIDE ENCODER AND DECODER SYSTEM FOR RLL (1,7) CODE

BACKGROUND OF THE INVENTION

This invention relates to a system for sequentially encoding successive parallel bytes of data into an RLL symbol string or for decoding, from an RLL symbol string, a sequence of parallel bytes of data.

As is known, conventional computer systems utilize magnetic disks for data storage. In order to maximize the amount of data stored on a disk, many such systems normally employ some form of run-length-limited (RLL) coding to encode data prior to entry onto a disk, which provides particularly dense packing of disk-stored data.

In the family of RLL codes, the (1,7) format is gaining increasing acceptance in the industry as the preferred RLL coding format for present magnetic disk technology. In employing the RLL (1,7) coding format, a sequence of unencoded binary data is converted into an encoded bit string in which each one in a coded bit sequence must be separated from the nearest adjacent one by at least one, but no more than seven zeros. In this format, the most efficient coding rate results when every two unencoded data bits are converted into three coded bits. Conversely, in the decoding process, three coded data bits are converted into two decoded data bits. This technique is taught in detail in U.S. Pat. No. 4,413,251 to R. L. Adler et al, which is assigned to the assignee of this patent application.

A typical prior art architecture employing RLL (1,7) coding in a magnetic disk storage system is illustrated in FIG. 1. As is typical, unencoded data from a data processing system is provided to the encoder section of an encoder/decoder (ENC/DEC) through a serializer/deserializer (S/D). When provided to the serializer/deserializer section, the data is normally in parallel byte form, which must be serialized into a sequence of 2-bit groups. Each 2-bit group provided to the encoder results in the provision of three encoded bits that go to a buffer (B) for serialization into an encoded, bit-wide data string that is processed by drive circuitry for writing onto a magnetic disk. In the industry, this is referred to as bit-by-bit encoding. When data is read from the disk, a bit-wide encoded data string is provided through the buffer B in the form of successive groups of three encoded bits to the decoder section of the encoder/decoder. Each successive group of three encoded bits is decoded to a group of two data bits (bit-by-bit decoding). The succession of bit pairs from the decoder are converted by the serializer/deserializer into a succession of bytes that are forwarded to the data processing system.

An artifact of the bit-by-bit coding system of FIG. 1 is the requirement for at least two conversion clocks: an $f_C$ clock for the encoded bit channel and a $\frac{2}{3} f_C$ clock for the transfer of data between the serializer/deserializer S/D and the buffer B.

The $f_C$ clock can be derived conventionally from a disk servo clock while writing information to a disk or from encoded read data obtained from a disk while reading information from the disk. Normally, $f_C$ is obtained under either circumstance through a voltage-frequency oscillator (VFO).

The $\frac{2}{3} f_C$ clock is usually derived by use of a second VFO synchronized to the $f_C$ clock. This imposes an added hardware requirement and requires the settling times of two VFO's to be accounted for when the timing source to the $f_C$ VFO is switched.

Moreover, the FIG. 1 architecture requires an extra format conversion for unencoded and decoded data passing between the serializer/deserializer and encoder/decoder, further adding complexity to the system.

SUMMARY OF THE INVENTION

The technical problem that is solved by the system of the invention is the elimination of the need for an odd $\frac{2}{3} f_C$ clock to shift unencoded or decoded data relative to the bit rate of the encoded channel. The invention is based upon the simultaneous coding conversion of an entire byte of data, which permits the system to transfer decoded or unencoded data at the byte rate and eliminates the requirement for the odd $\frac{2}{3}$ rate clock.

In particular, the system is one for encoding an input byte-wide data sequence into an output run-length-limited (RLL) symbol string and for decoding an output byte-wide data sequence from an input RLL symbol string.

The system includes an RLL encoder that responds to consecutive parallel unencoded bytes occurring at a byte rate in an input byte-wide data sequence by producing an output RLL symbol sequence including consecutive groups of parallel RLL symbols.

A format converter is connected to the RLL encoder for converting the output RLL symbol sequence into an output RLL-encoded symbol string having a symbol string rate which is a whole multiple of the byte rate. The format converter further responds to an input RLL symbol string having an input symbol string rate, by providing an input RLL symbol sequence including consecutive groups of parallel RLL symbols.

An RLL decoder responds to the input RLL symbol sequence constructed by the format converter by producing, at the byte rate, an output byte-wide data sequence including consecutive parallel bytes of decoded data.

The primary objective of the system is to provide a bidirectional code conversion interface between a channel conducting a sequence of consecutive parallel bytes of data at a byte rate and a data channel conducting strings of RLL (1,7) symbols at a symbol string rate.

An advantage of the present invention is the elimination of the need for an odd clock signal having $\frac{2}{3}$ the frequency of the symbol channel.

Other objectives and advantages of the present invention will become more apparent when the following detailed description is read in light of the below-described drawings.

BRIEF DESCRIPTION OF THE DRAWINGS

FIG. 7 is a circuit diagram of the encoder used to simultaneously encode a byte of unencoded data into twelve bits of RLL (1,7)-encoded data.

DETAILED DESCRIPTION OF THE PREFERRED EMBODIMENT

In the description which follows, a byte of data is taken, as in the usual sense, to denote a sequence of eight adjacent binary digits (bits) that are operated upon as a unit. A parallel byte refers to the eight bits transferred simultaneously on a data channel including 8 parallel transmission paths. A string refers to a linear sequence of bits. A coded symbol consists of a group of three consecutive bits resulting from an encoding operation performed on two bits of unencoded data. A symbol string is a string of encoded bits in which successive groups of three bits form successive symbols.

In the magnetic disk storage art, weight is assigned a bit in a data string according to its place in the string. The first bit is accorded the most significance (MSB) and is assigned the lowest-numbered subscript, e.g., $x_0$. Bits occurring after the MSB have correspondingly less significance, but subscripts of higher magnitude. Thus, in a serial byte, bit $x_0$ (the first bit) is the MSB while bit $x_7$ (the last bit) is the LSB. In the following description, this significance convention is observed for unencoded bits (x), encoded bits (y), and symbols (Y).

Figure 1:
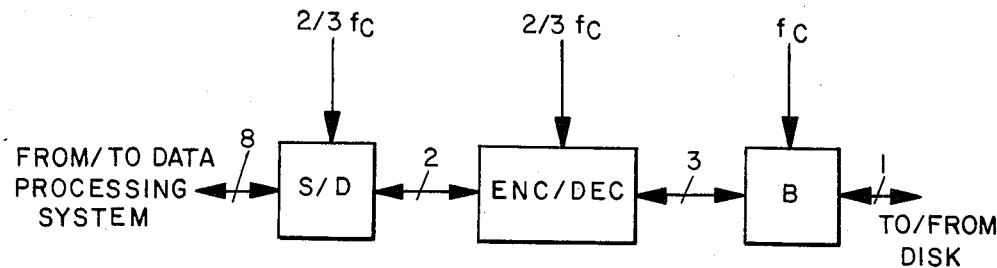
FIG. 1 is a block diagram of code conversion architecture in the prior art.
Figure 2:
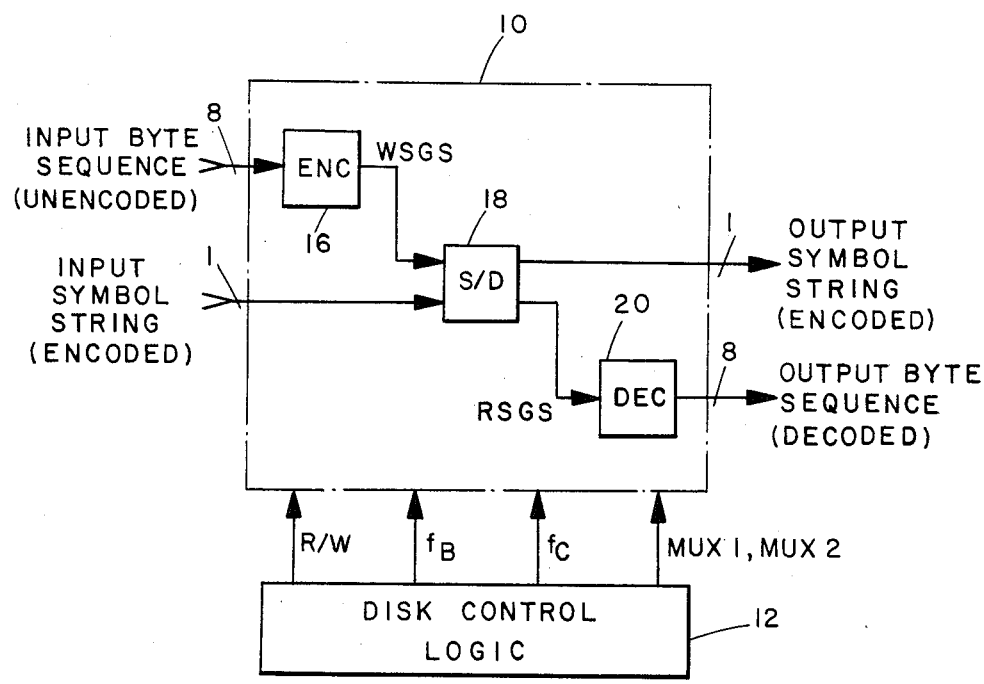
FIG. 2 is a block diagram illustrating the general architecture of the system of the invention.

As illustrated in FIG. 2, the system of the invention, enclosed in the dashed outline indicated by reference numeral 10, accepts an input byte sequence constituting a succession of parallel bytes on a data channel that is eight bits wide. Each byte consists of eight simultaneously-transferred bits. The byte sequence is fed to the system 10 for being encoded into an output consisting of a string of RLL (1,7)-encoded symbols.

An input byte sequence can be provided from a conventional data processing system (not shown) for being entered (written) onto a magnetic disk (also not shown) for storage and later retrieval. The input byte sequence is converted by the system of the invention to an output symbol string, in which form it is stored on the disk.

When data stored on the magnetic disk is to be retrieved (read), an input symbol string is obtained from the disk and provided to the system 10 for conversion into a decoded output byte sequence that is forwarded to the data processing system.

As is conventional, the system 10 operates in conjunction with conventional disk control logic 12 that provides a read/write (R/W) gate signal for defining the mode of operation for the system 10. In one state, the R/W signal denotes a disk read operation, and in another state, a disk write operation. The control logic includes a VFO (not shown) to generate a symbol channel clock $f_C$ and a multi-phase byte clock $f_B$ that is constrained to be an integer sub-multiple of $f_C$. The control logic 12 also provides conventional signals MUX 1 and MUX 2 for controlling conventional multiplexing and format conversion circuitry in the system 10.

The system 10 is a byte-wide encoder and decoder for RLL (1,7) code and includes an RLL encoder 16 that accepts consecutive bytes of an input byte sequence at a byte rate $f_B$ and encodes them according to RLL (1,7) coding rules into a write symbol group sequence (WSGS). The write symbol group sequence consists of a sequence of groups of parallel encoded symbol bits.

The $\frac{2}{3}$ conversion rate constrains each group of the write symbol group sequence to twelve bits, which form 4 symbols.

The write symbol group sequence is provided to a serializer/deserializer circuit 18 that, during a write mode of operation, performs parallel-to-serial format conversion to convert the 12-bit wide write symbol group sequence into a bit-wide output symbol string having a string rate $f_C$ that is equal to 12 $f_B$.

The serializer/deserializer circuit 18, during a read mode of operation, receives a bit-wide input symbol string at the string rate $f_C$ and performs serial-to-parallel format conversion on the input string to produce a read symbol group sequence (RSGS) consisting of the succession of groups of twelve parallel encoded data bits. The read symbol group sequence is provided to an RLL decoder 20 which converts the sequence to a corresponding parallel byte sequence of decoded bits that is forwarded at the byte rate $f_B$ to the data processing system as read data.

In the operation, explained below, of the system 10 in converting between symbol strings and parallel byte sequences, only 2 clock signals, $f_C$ and $f_B$, are required. The byte clock $f_B$ is necessary to stage parallel bytes into and out of the system 10 and to move symbol groups between the encoder 16 and the format converter 18, and between the format converter 18 and the decoder 20. The symbol channel clock $f_C$ clocks coded data strings into and out of the system 10. Thus, the advantage of the system 10 is clearly illustrated in FIG. 2: the requirement for the odd $\frac{2}{3}$ clock to aid in encoding and decoding is eliminated.

Figure 3:
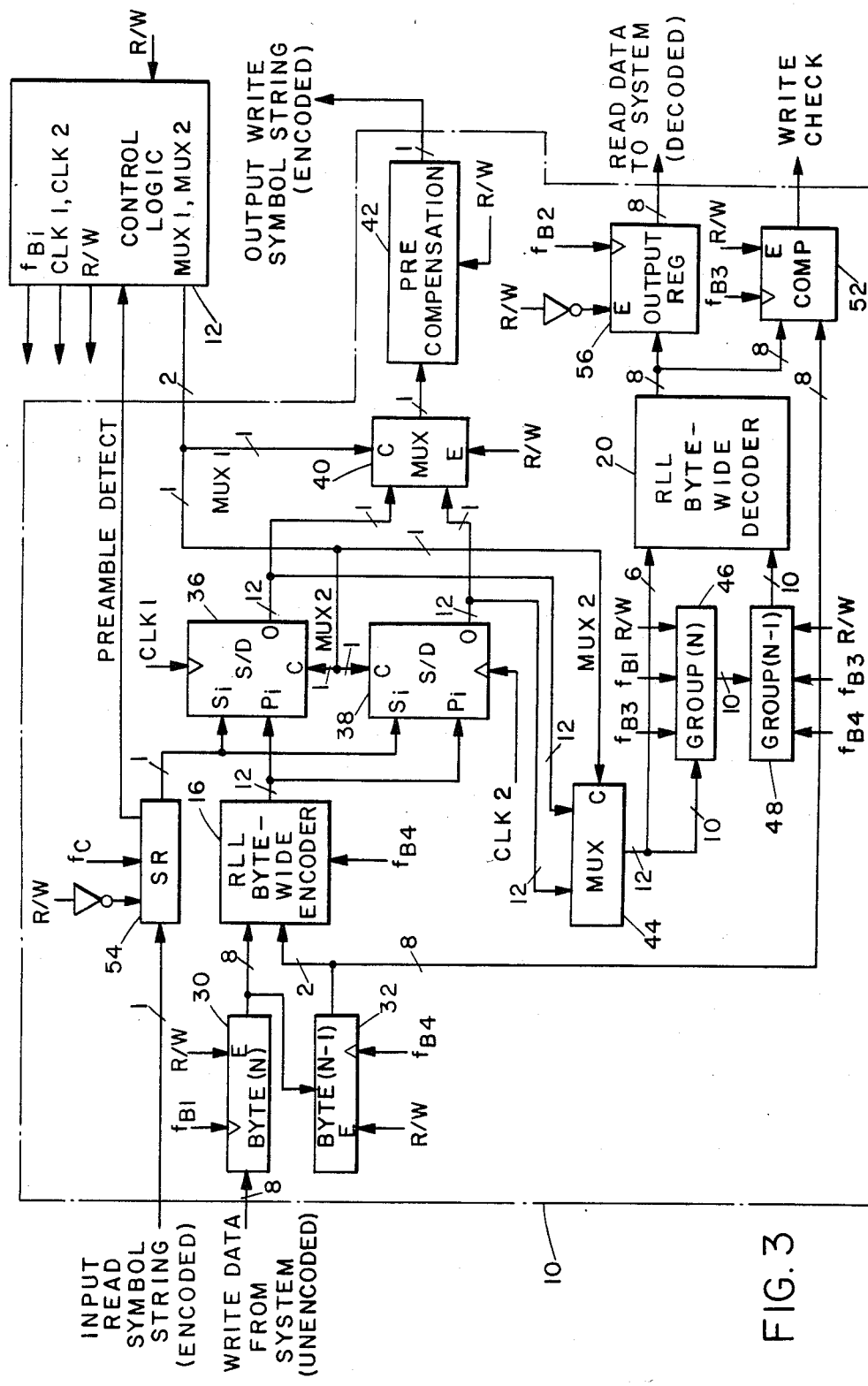
FIG. 3 is a more detailed illustration of the functional blocks included in the system of the invention.
Figure 4:
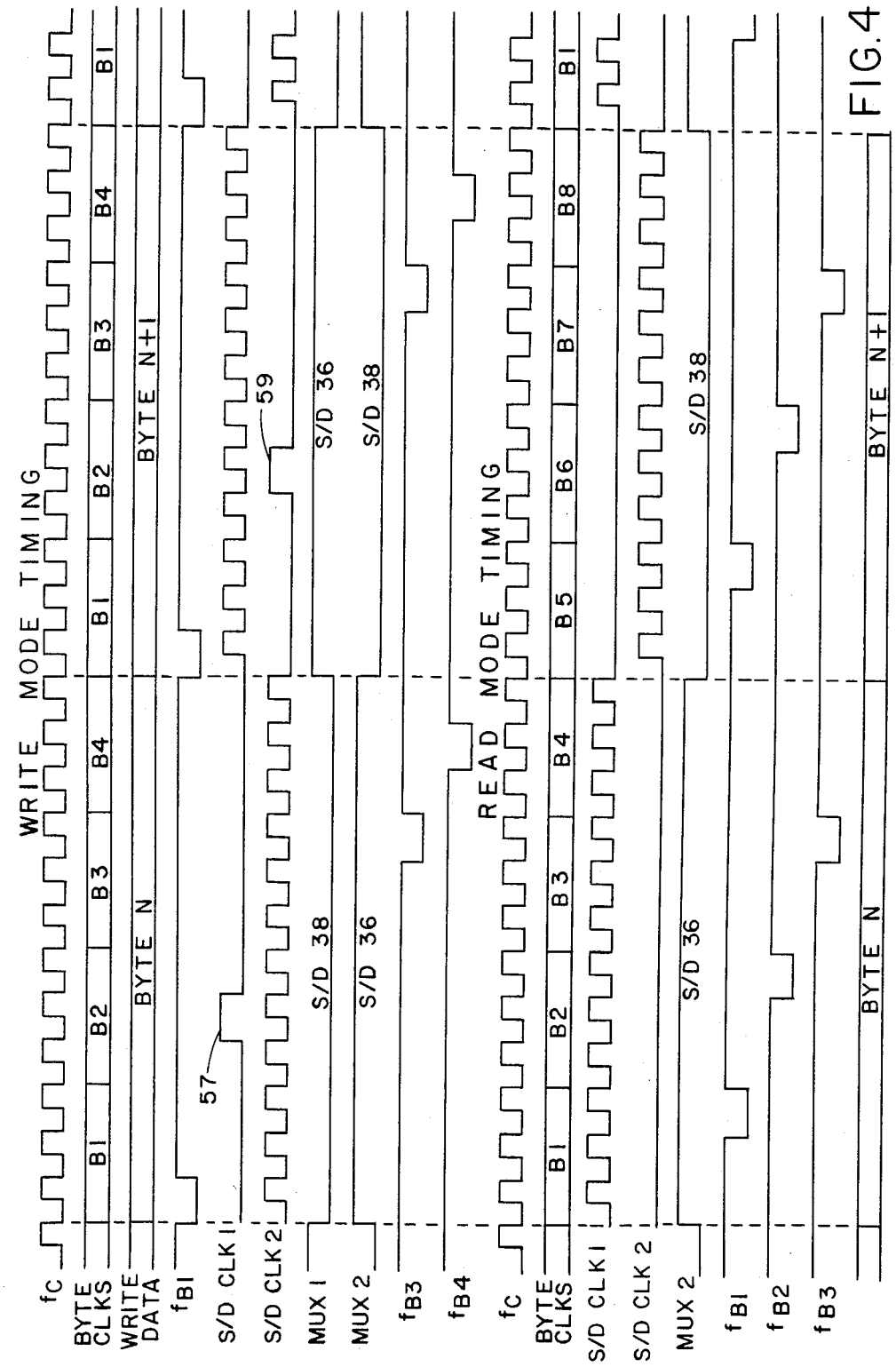
FIG. 4 is a waveform diagram illustrating read and write modes of operation of the system of the invention.

Referring now to FIGS. 3 and 4, the system 10 preferably operates in a conventional magnetic disk storage unit for encoding a parallel byte sequence of data to be written to a magnetic disk. The parallel byte stream is provided as write data from a data processing system (not shown) and is delivered unencoded to the system 10. The write data is converted by the system of the invention to an RLL (1,7)-encoded bit string comprising symbol channel write data which is submitted to disk drive electronics (not shown) for being entered on a magnetic disk (also not shown). This mode of operation is referred to hereinbelow as the WRITE mode and is signified by a WRITE state of the R/W signal produced by the control logic 12.

In a READ mode of operation (signified by a READ state of the R/W signal), an RLL (1,7)-encoded bit string comprising symbol channel read data obtained from the disk drive electronics for delivery to the data processing system is delivered to the system 10 for conversion to a decoded parallel byte sequence which is transferred by conventional means to the data processing system.

In the WRITE mode of operation, the byte-wide encoder and decoder system for RLL (1,7) code pictured in FIG. 3, a sequence of parallel bytes that are to be encoded for being written onto a magnetic disk are staged, byte-by-byte into the system through a first input latch 30, which is enabled by the WRITE state of the R/W signal. Once entered into the latch 30, a byte of unencoded data is available from the output of the latch 30 to a second latch 32 and to the RLL (1,7) byte-wide encoder 16. The encoder 16 is capable of accepting a byte (byte (N)) of unencoded data comprising eight parallel bits, $x_0$-$x_7$ ($x_0$=MSB), together with the least significant two bits, $x'_6$ and $x'_7$, of the preceding byte (byte (N−1)) and encoding byte (N) according to a known RLL (1,7) conversion algorithm having a coding rate of $\frac{2}{3}$.

As a result of the $\frac{2}{3}$ coding rate, encoding byte (N) results in the production by the encoder of a write symbol group (WSG (N)) of twelve encoded bits, $y_0-y_{11}$ ($y_0$=MSB). In keeping with convention, each group of twelve encoded bits comprises 4 symbols, $Y_0-Y_3$ (where $Y_0$ is the most significant symbol), with each symbol defined by a respective set of three encoded bits. Thus, for example, symbol $Y_1$ is defined by encoded bits $y_3-y_5$.

The sequence of parallel bytes staged into the encoder 16 from the input latch 30 results in the provision by the encoder of a corresponding sequence of write symbol groups termed a write symbol group sequence (WSGS) that is fed simultaneously to a pair of conventional serializer/deserializers (S/D) 36 and 38 that constitute the S/D circuit 18.

Each of the S/D's 36 and 38 has a $P_i$ (parallel input) port and a $S_i$ (serial input) port. When the system of the invention is performing encoding to support write operations, alternating levels of the MUX 2 signal on the C (control) ports of the S/D's permit the entry of alternate write symbol groups provided by the encoder 16 through the $P_i$ ports of the S/D's. While either one of the S/D's 36 or 38 is receiving one write symbol group from the encoder 16, the other is converting the parallel format of the previous write symbol group by shifting the bits of the previous group serially through one of the 12 signal leads connected to the O (output) port of the S/D. The serialized symbol group is provided to a conventional 2-to-1 multiplexer 40, which is operated by the control logic 12 to interleave serialized symbol groups provided alternately from the S/D's 36 and 38 into a continuous symbol string of encoded bits. The encoded symbol string output by the multiplexer 40 is fed to conventional circuitry 42 which performs precompensation on the bits of the output symbol string to prepare them for being written as symbol channel write data onto the magnetic disk.

During a write operation, after entry of one write symbol group, say WSG (N), into a respective S/D through its $P_i$ port, but before serial shifting of the group to the multiplexer 40, write symbol group (N) is provided in parallel to another conventional 2-to-1 multiplexer 44 while the other S/D is serially shifting the previous write symbol group, WSG (N−1), serially to the multiplexer 40. Thus, the multiplexer 44 interleaves the symbol groups to reform the write symbol group sequence, which is provided, during write operations, through the output of the multiplexer 44 to a pair of conventional, serially-connected latches 46 and 48. As shown in FIG. 3, only the least significant ten bits of each symbol group are entered into the latches 46 and 48, while the most significant six bits of the currently-encoded symbol group are fed, together with the least significant ten bits of the previously-encoded symbol group, to the RLL byte-wide decoder 20.

As explained below, before WSG (N) is shifted serially through multiplexer 40, the decoder 20 receives the six encoded symbol bits of WSG (N) and uses them, together with the least significant ten bits of WSG (N−1) stored in the latch 48, to decode the byte (byte N−1) from which WSG (N−1) was encoded. The decoded byte (N-1) is provided by the decoder 20 to a conventional digital comparator 52 where it is compared with the unencoded form of byte (N−1) stored in the latch 32.

The output of the comparator 52 comprises a WRITE CHECK signal which, in one state, indicates correspondence between the decoded byte available from the decoder 20 and the stored byte available from the latch 32. The other state of the WRITE CHECK signal indicates noncorrespondence and can be used to institute standard error-correcting procedures in other components of the disk interface with which the system of the invention is used.

When data is to be obtained in encoded form from the magnetic disk and returned coded to the data processing system, the control logic 12 changes the R/W signal to its READ state and the disk drive circuitry provides symbol channel read data obtained from the magnetic disk in the form of an input encoded symbol string. The input symbol string is fed through a shift register 54 to the $S_i$ ports of the S/D's 36 and 38. The S/D's are controlled to receive alternate groups of twelve encoded bits from the input string and to provide them, alternately in parallel form, through the multiplexer 44 to the decoder 50 in the manner described hereinabove. The alternate groups of parallel encoded bits are formed by the multiplexer 44 into a read symbol group sequence that is fed to the decoder 50 in the manner described hereinabove. The read symbol group sequence is decoded by the decoder 20 into an output sequence of parallel bytes that are returned to the data processing system through an output register 56 as read data.

Figure 5:
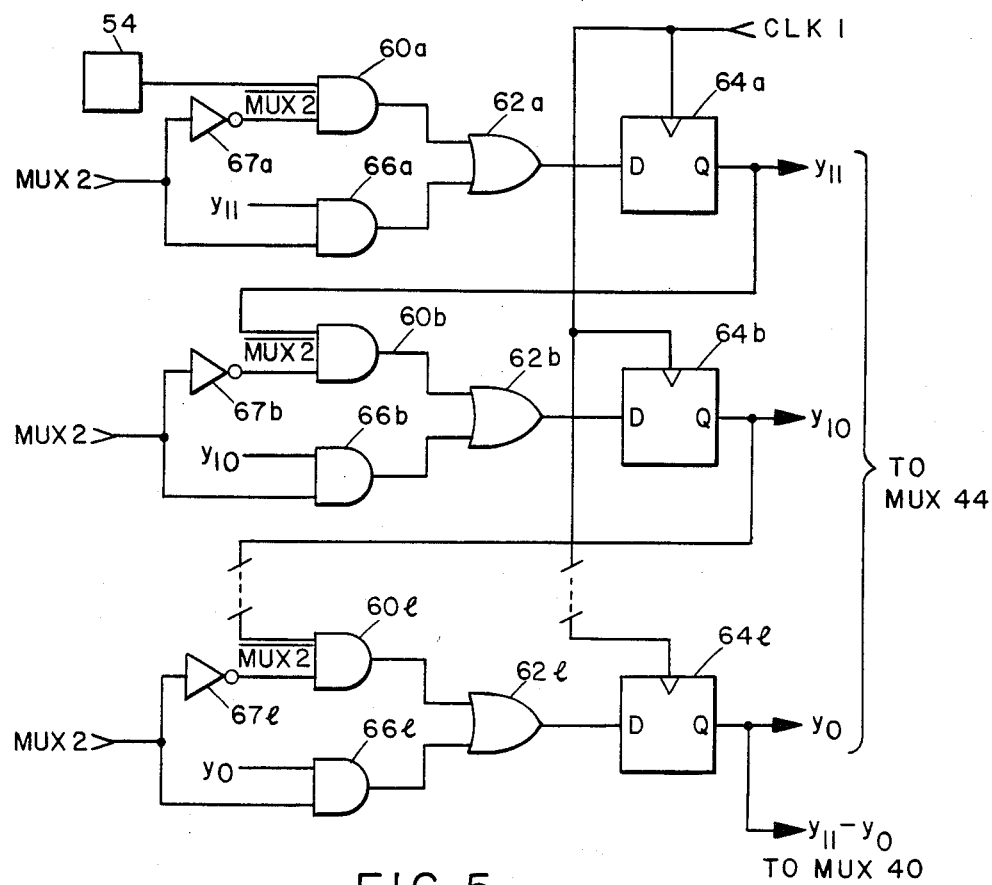
FIG. 5 is a schematic diagram illustrating a format converter used in the system of the invention.

The sequence of operations undertaken by the system 10 during write- and read-related operations can be understood now with reference to FIGS. 3-5. In FIG. 4, which shows the timing of the write and read operational sequences, the symbol string clock is labelled $f_C$. In addition, the BYTE CLKS signal represents a series of phased byte clock signals ($f_{B1}-f_{B4}$) that is cycled once for each byte of data encoded or decoded by the system 10. Since there is a $\frac{2}{3}$ ratio of unencoded to encoded bits, one byte clock cycle is completed for every twelve pulses of $f_C$, and each byte clock has the frequency $f_C/12$. Every twelve pulses of $f_C$ coincides with the completion of one encoding or decoding operation for each byte of data received or provided by the system 10.

In FIG. 4 all of the operative signals provided to the system 10 are produced conventionally by the control logic 12. Disk controllers having the ability to provide signals corresponding to those illustrated in FIG. 4 are well known in the art, the disk controller in the IBM disk storage system having the product number 3380 being one example.

The write mode begins with the provision of the WRITE state of the R/W signal to the system 10. The WRITE state of the R/W signal enables the operations of the latches 30 and 32, the multiplexer 40, the precompensation circuit 42, and the comparator 52. The signal is provided in inverted form to the shift register 54 and the output register 56 to prevent their operating during write mode operation. During write operations, the R/W signal gates $f_{B3}$ to the latch 46 and $f_{B4}$ to the latch 48. A write mode sequence of operation includes the provision of a parallel byte of data (byte (N)) to the latch 30, with the byte being latched on the negative level of $f_{B1}$ while present at the input of the latch. As soon as the byte is latched, it is present on the output of the latch 30 and encoded by the encoder 16. After encoding, the symbol group WSG (N) of twelve parallel encoded bits resulting from the encoding of byte (N) is loaded into S/D 36 by a gated write group load pulse 57 that occurs in CLK 1 during the write mode. The pulse 57 occurs during the second phase (B2) of the byte clock. In the next encoding cycle, twelve shift pulses are provided in CLK 1 to serially shift out the ISG entered by the pulse 57.

The positive state of the MUX 2 signal couples the parallel output of the S/D 36 to the output of the multiplexer 44 where, as explained above, the most significant six bits of write symbol group (N) are made available to the decoder 20. The decoder then decodes WSG (N−1). At the negative level of $f_{B3}$, the least significant ten bits of write symbol group (N) are entered into the latch 46. At this point, the previous symbol group, group (N−1), will have previously been shifted to the latch 48 from the latch 46. Simultaneously with the entry of the ten least significant bits of write symbol group (N) into the latch 46, the byte clock $f_{B3}$ sets the comparator 52 so that the decoded byte corresponding to symbol group (N-1) (that is, byte (N−1)) is compared against the unencoded version of byte (N−1) stored in the latch 32. Assuming that the unencoded and decoded bytes correspond, the control logic will, during the fourth phase B4 of the byte clock, produce $f_{B4}$. The fourth phase of the byte clock $f_{B4}$ enters byte (N) into the latch 32, and the ten least significant bits of symbol group (N) into the latch 48.

During the just-described encoding cycle for byte (N), twelve shift pulses of the gated clock signal CLK 2 will be provided by the controller 12 to S/D 38 to enable it to serially shift write symbol group (N−1) to the multiplexer 40. The negative state of the MUX 1 signal passes the serialized write symbol group (N−1) to the precompensation circuit 42.

Next, when byte (N+1) is available to be written to the magnetic disk, the just-described encoding cycle is performed again, with the exception that the roles of the S/D's 36 and 38 are reversed. That is, byte (N+1) is entered on $f_{B1}$ into the latch 30, and coded, causing the production of the write symbol group (N+1). The write symbol group (N+1) is entered in parallel into the S/D 38 by the provision thereto of gated write group load pulse 59 that occurs in CLK 2 during the write mode. Now, since the MUX 1 and MUX 2 polarities are reversed, write symbol group (N) is shifted from S/D 36 through the MUX 40 by the provision of twelve pulses of the CLK 1 signal to the S/D 36. It should be noted that the CLK 1 and CLK 2 signals are in phase with the MUX 1 and MUX 2 signals, which permits the multiplexer 40 to seamlessly interleave the serialized symbol groups. Further, the twelve shifting pulses of CLK 1 and CLK 2 when active have the frequency of $f_C$, and therefore ensure that the encoded bit string has the frequency $f_C$.

While write symbol group (N) is being serially shifted from the S/D 36, the negative state of the MUX 2 signal causes symbol group (N+1) to be provided through the multiplexer 44 and used in the decoding of symbol group (N). This permits a decoded version of byte (N) to be compared with the unencoded version stored in the latch 32.

Reference to FIG. 5 will provide an understanding of the operation of the serializer/deserializers 36 and 38. FIG. 5 illustrates the S/D 36 and includes an array of AND gates $60_a$–$60_l$ that feed through OR gates $62_a$–$62_l$ to the respective input D ports of clocked storage devices $64_a$–$64_l$. Similarly, AND gates $66_a$–$66_l$ are fed through the respective OR gates $62_a$–$62_l$ to the respective inputs of the storage devices $64_a$–$64_l$. Parallel entry of twelve bits of a write symbol group into the S/D 36 is permitted by the positive state of the MUX 2 signal which enables the gates $66_a$–$66_l$: when the CLK 1 load pulse 57 is fed simultaneously to the clock inputs of the storage devices $64_a$–$64_l$, the current write symbol group is entered into the S/D 36. To shift out the symbol group on the following encoding cycle, the MUX 2 signal changes state by going low. As illustrated, the low state of MUX 2 is inverted by the inverters $67_a$–$67_l$ to produce a conventional inverse logic signal $\overline{\text{MUX 2}}$ which enables AND gates $60_a$–$60_l$. With $\overline{\text{MUX 2}}$ high, the symbol group bits are fed sequentially through the S/D 36 from the storage device $64_a$ through the storage device $64_l$, with the serial output being available at the Q output port of device $64_l$.

It should be evident that the S/D 38 can be implemented in exactly the fashion illustrated for the S/D 36 in FIG. 5 simply by exchanging the MUX 2 and $\overline{\text{MUX 2}}$ signals, with the positive state of the MUX 2 signal provided to enable the gates $60_a$–$60_l$ and the inverted state, $\overline{\text{MUX 2}}$, enabling the gates $66_a$–$66_l$. Further, the clock signal input would be changed to CLK 2.

Read mode operations comprise a sequence of decoding cycles, each defined by one succession of the four phase byte clocks B1–B4. The READ state of the R/W signal disables latches 30 and 32, multiplexer 40, and comparator 52; it enables the registers 54 and 56. The WRITE state of the R/W signal gates $f_{B1}$ to the latch 46 and $f_{B3}$ to the latch 48.

In a read mode operation, the control logic 12 will have been alerted by the provision of a read request or command from the data processor to search for a standard pattern of encoded bits comprising a preamble in the data field to be read. As is conventional, when the addressed storage segment is initially read from the magnetic disk, the read data is shifted serially into the shift register 54 from the disk drive electronics. The contents of the shift register 54 are continuously read in parallel by the control logic 12 so that when the preamble denoting the beginning of the addressed storage sector is recognized, the control logic 12 can synchronize the provision of the gated clocks CLK 1 and CLK 2 to the S/D's 36 and 38. Thus, the first pulse of the twelve shift pulses of one of the gated clocks will be made available to one of fthe S/D's 36 or 38 in phase with the availability, at the serial output of the shift register 54, of the first encoded bit of the input bit string.

When the preamble is detected, the S/D's are driven out of phase to capture alternate groups of twelve serial bits from the input symbol string. While one S/D is receiving twelve encoded bits, the other is loading the previous twelve bits in parallel as an input symbol group (ISG) through the multiplexer 44 to the decoder 20. Thus, in FIG. 5, when MUX 2 is negative and CLK 1 is gated on, symbol bits are shifted serially from the register 54 into the devices $60_a$–$60_l$. After twelve shift pulses of CLK 1, twelve symbol bits will be held in S/D 36. Then, when MUX 2 rises, and CLK 2 is gated on, S/D 38 acquires the next twelve bits in the input symbol string.

Assuming now that input symbol group (N) has been entered into the S/D 36, a byte decode cycle will commence just after the rising edge of the first pulse of gated clock CLK 2. The twelve shift pulses of the gated clock and the positive state of the MUX 2 signal will shift the twelve encoded bits of input symbol group (N+1) into S/D 38. During the first byte clock phase B1 of the decoding cycle, the positive state of the MUX 2 signal permits input symbol group (N) to be available on the output of the multiplexer 44. This provides six most significant bits of symbol group (N) to be available to the decoder, thereby enabling the decoding symbol group (N−1). During the first phase of the byte clock, the READ state of the R/W signal gates $f_{B1}$ to the latch 46, which enters the ten least significant bits of symbol group (N) into the latch 46. Next, $f_{B2}$ is provided to the output register 56 which clocks the decoded byte (N−1) into the register, thereby providing it in parallel-byte format as read data to the data processing system. Finally, the R/W signal gates $f_{B3}$ to the latch 48, transferring thereto the ten least significant bits of the input symbol group (N). During the next decode cycle in the read mode, input symbol group (N+1) is transferred in parallel from S/D 38 to be available through the multiplexer 44. This enables the decoder 50 to convert input symbol group (N) into output byte (N) with the sequence of operations described above for the previous decode cycle implemented for input symbol groups (N+1) and (N).

Figure 8:
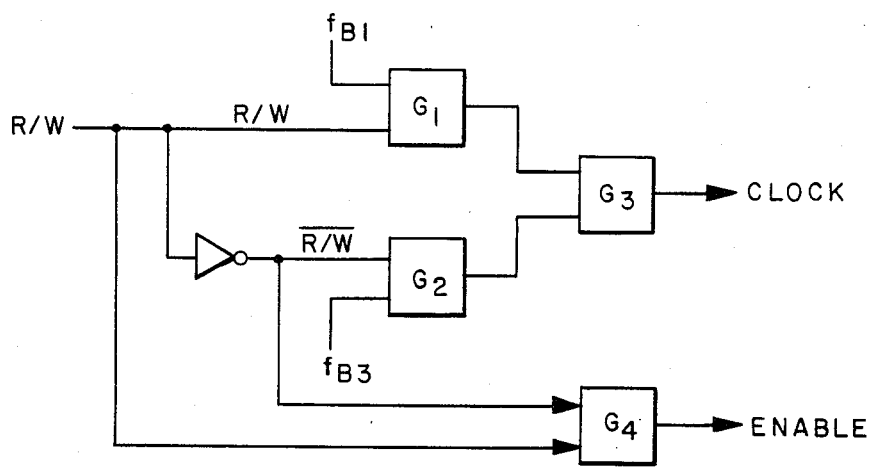
FIG. 8 is a gating circuit used to steer byte clock signals during read and write operations of the invention.

The use of the R/W signal to gate byte clocks to the registers 46 and 48 can be understood by reference to FIG. 8. In FIG. 8, one state of R/W permits $f_{B1}$ to pass through two gates ($G_1$ and $G_3$) to the clock input of, for example, register 46. The opposite state R/W permits $f_{B3}$ to pass to the clock input through gates $G_2$ and $G_3$. The gate $G_4$ passes either R/W or R/W to the enable port of the register.

Figure 6:
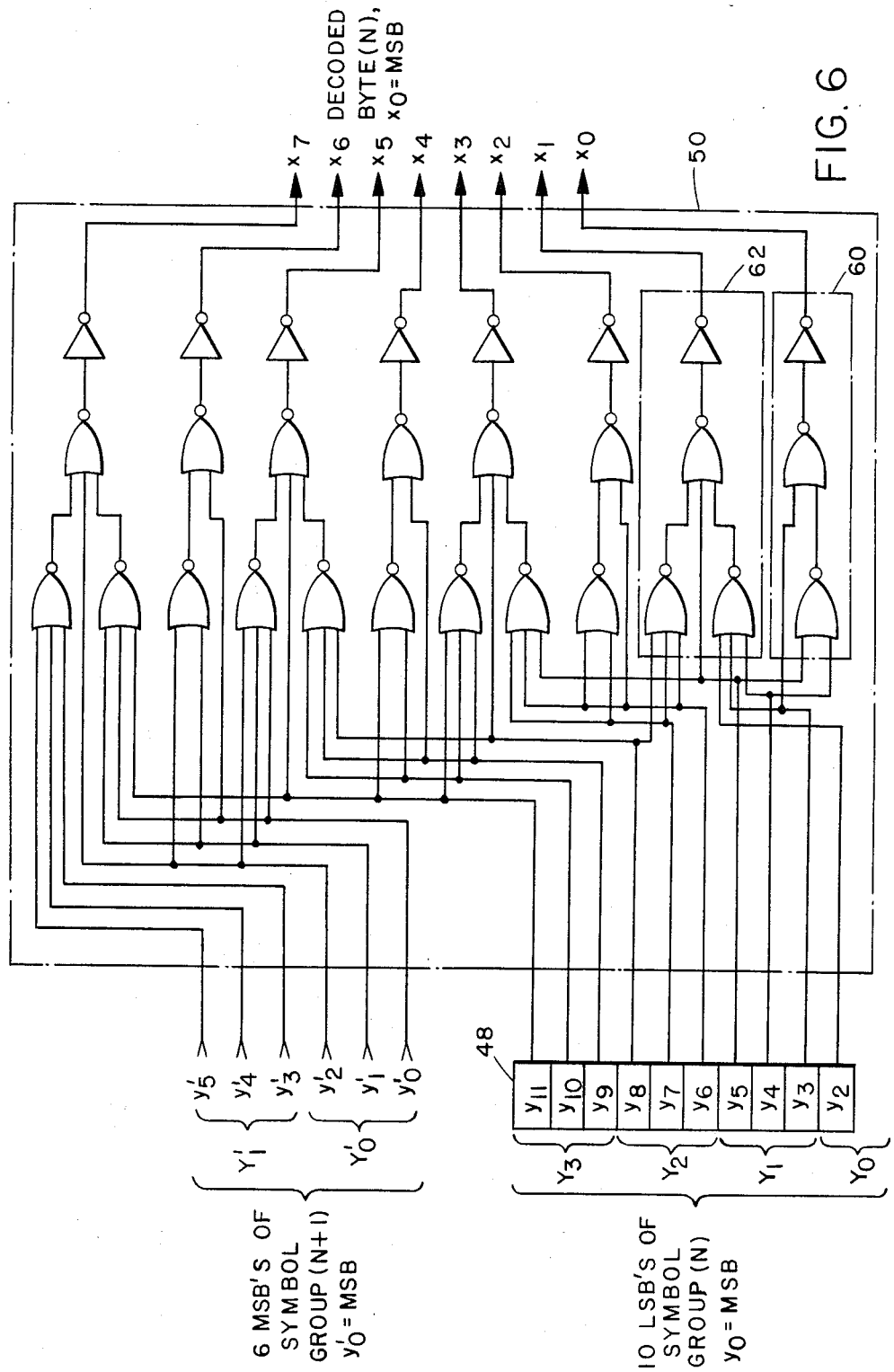
FIG. 6 is a schematic diagram illustrating a decoder for converting twelve bits of RLL (1,7)-encoded data simultaneously into a parallel byte of decoded data.

With reference now to FIGS. 6 and 7, the structures and operations of the RLL byte-wide decoder 20 and the RLL byte-wide encoder 16 can be understood. In the discussion which follows, U.S. Pat. No. 4,413,251 to Adler et al and assigned to the assignee of this patent application, is incorporated herein by reference for the purpose of establishing the mathematical basis for the coding conversion operations of the decoder and the encoder. The tabular expression of an RLL (1,7) coding algorithm that encodes bit-by-bit at a ⅔ rate is found in Table IV of the incorporated patent. As taught in the incorporated patent, the hardware implementation for an RLL (1,7) decoder that obtains bits $x_n$ and $x_{n+1}$ from the three RLL symbols, $$Y_n = (y_n, y_{n+1}, y_{n+2})$$

$$Y_{n+1} = (y_{n+3}, y_{n+4}, y_{n+5})$$

$$Y_{n+2} = (y_{n+6}, y_{n+7}, y_{n+8})$$

is derived from the following Boolean expressions, which are converted to their NOR expression equivalents:

$$x_n = (y_{n+3} + \overline{(y_{n+4} + y_{n+5})}) = \overline{\overline{(y_{n+3} + \overline{(y_{n+4} + y_{n+5})})}} \quad (1)$$

$$x_{n+1} = ((y_{n+2} + y_{n+3} + y_{n+4}) \cdot \overline{y_{n+5}} \cdot (y_{n+6} + y_{n+7} + y_{n+8})) = \overline{\overline{((y_{n+2} + y_{n+3} + y_{n+4}) + y_{n+5} + \overline{(y_{n+6} + y_{n+7} + y_{n+8})})}} \quad (2)$$

The NOR expressions (1) and (2) are implemented by the decoder NOR gate sections 60 and 62, respectively, in FIG. 6. It should be evident that the pair of NOR sections 60 and 62 can be replicated four times to provide simultaneous decoding of a byte (eight decoded bits) from sixteen encoded bits spanning 6 adjacent symbols, $Y_0$–$Y'_1$, thus providing a look ahead to the two future channel symbols $Y'_0$ and $Y'_1$. In FIG. 6 the sixteen encoded bits are provided for the ten least significant bits of symbol group (N) stored in the latch 48 and the six most significant bits of symbol group (N+1) that are available to the decoder from the output of the multiplexer 44.

The buty-wide encoder might also be implemented by replicating the encoder taught in the incorporated Adler et al. patent four times to produce twelve encoded bits (4 symbols) at a time. However, as is known, the encoder in the incorporated patent relies upon the generation and storage of an intermediate 3-bit state for producing each coded symbol. Replication of circuitry for generating and storing the intermediate 3-bit states would result in a complicated and relatively slow-operating encoder. The encoder of FIG. 7 avoids concatenation of 3-bit state circuitry by enlarging the dependence of each encoded bit from two to four bits of unencoded data. This permits the realization of an RLL (1,7) encoder that provides simultaneous encoding of a parallel byte of data in which each resulting symbol is dependent upon only one state bit (in addition to four unencoded bits) for each encoding operation.

To understand the operation of the encoder of FIG. 7, consider any current symbol Y that comprises three encoded symbol bits ($y_0$, $y_1$, $y_2$) and that is encoded according to the algorithm of the Adler et al. patent from unencoded bits $x_0$ and $x_1$ contained in the bit string fragment ... $x_0 \, x_1 \, x_2 \, x_3$ ...

According to the encoding algorithm of the Adler et al. patent the current symbol Y has the functional dependence given in equation (3):

$$Y = f(z_1, z_2, z_3, x_0, x_1) \quad (3)$$

where $z_1$, $z_2$, and $z_3$ are current state bits resulting from the encoding of the symbol immediately preceding Y, and $x_0$ and $x_1$ are the two unencoded bits to be used in encoding Y.

For the prior art encoder, the Boolean expressions defining the coded bits forming the symbol Y are given by equations (4)-(6) below.

$$y_0 = (\overline{z_1} \cdot z_2) \quad (4)$$

$$y_1 = \overline{((z_1 + z_2 + z_3) \cdot \overline{(x_0 \cdot x_1)})} \quad (5)$$

$$y_2 = (z_3 \cdot \overline{(x_0 \cdot x_1)}) \quad (6)$$

As is known, while the symbol Y is being encoded, the state variables ($z'_1$, $z'_2$, and $z'_3$) for the next symbol to be encoded (Y') are, in the prior art encoder, determined by equations (7)-(9).

$$z'_1 = (x_0 \cdot z_3) \quad (7)$$

$$z'_2 = (x_0 \cdot \overline{z_3}) \quad (8)$$

$$z'_3 = (x_1 \cdot \overline{(x_0 \cdot z_3)}) \quad (9)$$

Finally, expressions for the next symbol $Y' = (y'_2, y'_1, y'_0)$ following Y may be obtained from equations (4)-(6) by substituting equations (7)-(9) for $z_1$, $z_2$, and $z_3$, respectively, and by substituting the two unencoded bits $x_2$ and $x_3$ for the bits $x_0$ and $x_1$. The next symbol expressions are given by the reduced Boolean equations (10)–(12).

$$y'_0 = (\overline{z'_1 \cdot z'_2}) = (\overline{(x_0 \cdot z_3)} \cdot x_0) \quad (10)$$

$$y'_1 = \overline{((z'_1 + z'_2 + z'_3) \cdot \overline{(x_2 \cdot x_3)})} = \overline{((x_0 + x_1) \cdot \overline{(x_2 \cdot x_3)})} \quad (11)$$

$$y'_2 = \overline{(z'_3 \cdot \overline{(x_2 \cdot x_3)})} = (x_1 \cdot \overline{((x_0 \cdot z_3)} \cdot \overline{(x_2 \cdot x_3)})) \quad (12)$$

It is noted that, in the next state expressions (7)–(9) and in the next symbol equations (10) and (12), a $z_3$ variable always appears with $x_0$ in the form $\overline{x_0 \cdot z_3}$. They have defined a new state variable w that is given by equation (13).

$$w = \overline{(x_0 \cdot z_3)} \quad (13)$$

This permits the further reduction of equations (10)–(12) to the equations (14)–(16) given below.

$$y'_0 = (w \cdot x_0) \quad (14)$$

$$y'_1 = \overline{(x_0 + (x_1 \cdot \overline{(x_2 \cdot x_3)}))} \quad (15)$$

$$y'_2 = (w \cdot x_1 \cdot \overline{(x_2 \cdot x_3)}) \quad (16)$$

Finally, the next state variable w' for encoding the following symbol is given by equation (17).

$$w' = \overline{(x_2 \cdot z'_3)} = \overline{(x_2 \cdot x_1 \cdot w)} \quad (17)$$

The set of equations (14) (17) define an encoding operation that produces an RLL (1,7) symbol Y' based upon four unconstrained, unencoded bits $x_0$–$x_3$ and a single state variable w.

In FIG. 7, the portion of the encoder 16 that is enclosed by the dotted line indicated by the reference numeral 70 implements, in a modular logic circuit, the encoding equations (14)–(16). A conventional 1-bit data storage device 72 provides the current state variable w to the modulator circuit 70. As shown in FIG. 7, the unencoded bits $x'_0$–$x'_7$ constitute a byte (N−1) stored in latch 32. The unencoded bits $x_0$–$x_7$ constitute the byte (N) following the byte (N−1) and are stored in latch 30. The bits $x_0$–$x_7$ are provided both to the encoder 16 and to the input of the latch 32. As required by equations (14)–(16), the adjacent bits $x'_6$ $x'_7$ $x_0$ $x_1$ are provided, together with w, to the modular circuit 70, which performs the encoding operation resulting in encoded bits $y_0$, $y_1$, and $y_2$ that form the (most significant) symbol $Y_0$ of the write symbol group WSG (N).

To encode the less significant symbols $Y_1$–$Y_3$ of WSG (N), state variables w', w''', and 2''' are produced by NAND gates 74–78, each of which implements the state variable equation (17). Each of the state variables produced by the NAND gates 74–78 are combined in a respective modular circuit equivalent to the modular circuit 70 with the proper bits in byte (N) to produce the remaining symbols, $Y_1$, $Y_2$, and $Y_3$ of WSG (N).

A next state variable w'''' is produced by the NAND gate 80 and provided as an input to the storage device 72 into which it is entered during a write mode encoding cycle by the occurrence of $f_{B4}$. Thus, when byte (N) is entered into the latch 32 and byte (N+1) into the latch 30, to prepare for the next write encoding cycle, the state variable w'''' will comprise the current state variable w that enables the encoding operation producing WSG (N+1).

It is to be understood that the particular embodiment of the invention herein described and shown in the drawings is merely illustrative and not restrictive of the fundamental invention. For example, the byte-wide operation of the system of the invention can be changed to operate an larger or smaller data groups. Thus, the encoder, decoder, and S/D's can be expanded to accommodate word-wide data groups. Further, various changes in the design structure and arrangement of the system of the invention may be made without departure from the spirit of the border aspects of the invention as defined in the appended claims.

I claim:

1. A system for encoding an input byte-wide data stream into an output run-length-limited (RLL) symbol string or for decoding an output byte-wide data stream from an input RLL symbol string, comprising:

RLL encoder means responsive to consecutive, unencoded parallel bytes occurring at a byte rate $f_B$ in an input byte-wide data stream for producing a first RLL (1,7) symbol sequence including consecutive groups of parallel RLL symbols, each of said bytes including at least eight bits;

format means responsive to a mode control signal and connected to said RLL encoder means for operating in a first mode by receiving said first RLL symbol sequence at said byte rate $f_B$ and converting said first RLL (1,7) symbol sequence into an output RLL symbol string having a symbol string rate $f_C = N \times f_B$, where N is a whole number which is greater than 1, or for operating in a second mode by receiving an input RLL symbol string having said symbol string rate $f_C$ and providing, at said byte rate, a second RLL (1,7) symbol sequence including consecutive groups of parallel RLL symbols;

RLL decoder means responsive to said second RLL (1,7) symbol sequence for providing an output byte-wide data stream including consecutive, decoded parallel bytes of data occurring at said byte rate $f_B$, each of said decoded bytes comprising at least eight bits; and mode control means for conditioning said mode control signal to operate said format means in either said first mode or said second mode according to a predetermined external condition.

2. The system of claim 1 wherein said RLL encoder means encodes a parallel byte at a ⅔ coding rate into a corresponding group of parallel RLL (1,7) symbols.

3. The system of claim 2 wherein said RLL encoder means includes:

latch means for receiving, in parallel format, one of said consecutive bytes and two bits from the byte preceding said received byte;

register means for receiving a single state bit derived from encoding said preceding byte; and logic means connected to said latch and register means for producing, in response to said received byte, said two bits, and said state bit, an RLL (1,7) encoded symbol group including twelve symbol bits and a next state bit for use in encoding the next succeeding byte.

4. The apparatus of claim 3 wherein said logic means includes an encoding module that produces an RLL (1,7) symbol based upon four consecutive unencoded bits in said consecutive bytes and one state bit.

5. The apparatus of claim 4 including four of said encoding modules.

6. The apparatus of claim 1 wherein said format means includes:

first storage means for, when said RLL encoder means receives said consecutive bytes, receiving each of a first set of alternating groups of parallel RLL symbols in said first RLL symbol group sequence and producing therefrom a first serial sequence of groups of serialized RLL symbols;

second storage means for, when said RLL encoder means receives said consecutive bytes, receiving each of a second group of alternating groups of parallel RLL symbols in said first RLL symbol group sequence and producing therefrom a second serial sequence of groups of serialized RLL symbols; and first multiplexing means connected to said first and second register means for interleaving said first and second serial sequences to produce said output RLL symbol string.

7. The apparatus of claim 6 wherein, when said format means receives said input symbol string, said first register means extracts from said symbol string alternating groups of serial symbols and produces therefrom a first parallel sequence of groups of parallel RLL symbols, and said second register means extracts from said input symbol string other alternating groups of serial symbols and produces therefrom a second parallel sequence of groups of parallel symbols, and said format means includes second multiplexing means connected to said first and second register means for interleaving said first and second parallel sequences to produce said second RLL symbol sequence.

8. An apparatus for converting a sequence of groups of unconstrained parallel bits having a group sequence rate into a fixed-rate, run-length-limited (RLL) (1,7) symbol string or for converting a fixed rate RLL (1,7) symbol string into a sequence of groups of unconstrained, parallel bits having said group sequence rate according to a predetermined external condition, comprising:

RLL encoding means for receiving an input bit group sequence including a sequence of groups of at least eight parallel bits that is input into said apparatus at a group sequence rate $f_B$ and for encoding, at said group sequence rate $f_B$, the input bit group sequence to produce a first RLL symbol group sequence including a sequence of groups of parallel RLL (1,7) symbols;

RLL decoding means for receiving a second RLL symbol group sequence including a sequence of groups of parallel RLL (1,7) symbols and for decoding, at said group sequence rate $f_B$, said second RLL symbol group sequence into an output bit group sequence including a sequence of groups of at least eight parallel bits that is output by said apparatus at said group sequence rate;

format conversion means connected to said RLL encoder means and to said RLL decoder means for operating in a first mode by converting said first RLL symbol group sequence into an output RLL (1,7) symbol string output by said apparatus at a symbol string rate $f_C = N \times f_C$, where N is a whole number which is greater than 1, or for operating in a second mode by converting an input RLL (1,7) symbol string that is input to said apparatus at said symbol string rate $f_C$ into said second RLL symbol group sequence and providing said second RLL symbol group sequence to said RLL encoding means; and mode control means connected to said format conversion means for conditioning said format means to operate in said first mode or said second mode according to said predetermined external condition.

9. The apparatus of claim 8 wherein each of said bit group sequences is a sequence of bytes having a byte rate and said RLL encoding means encodes each byte in the input bit group sequence at a ⅔ coding rate into a corresponding group of parallel RLL symbols having a (1,7) format.

10. The apparatus of claim 9 wherein said RLL encoding means includes:

staging means for receiving, in parallel format, a byte in a sequence of bytes, two bits from the preceding byte in said sequence of bytes, and a single state bit derived from encoding said preceding byte; and logic means connected to said staging means for producing, in response to said received byte, said two bits, and said state bit, an RLL (1,7)-encoded symbol group including twelve symbol bits and a next stable bit for use in encoding the next succeeding byte in said sequence of bytes.

11. The apparatus of claim 10 wherein said symbol channel bits include three consecutive bits that form an encoded symbol and said symbol is based upon four consecutive bits in said sequence of bytes.

12. The apparatus of claim 8 wherein said format means includes:

first register means for, when said RLL encoding means receives said input bit group sequence, receiving each of a first set of alternating groups of parallel RLL symbols in said first RLL symbol group sequence and producing therefrom a first serial sequence of groups of serialized RLL symbols;

second register means for, when said RLL encoding means receives said input group sequence, receiving a second set of alternating groups of parallel RLL symbols in said first RLL symbol group sequence and producing therefrom a second serial sequence of groups of serialized RLL symbols; and first multiplexing means connected to said first and second register means for interleaving said first and second serial sequences to produce said output RLL symbol string.

13. The apparatus of claim 12 wherein, when said format conversion means receives said input symbol string, said first register means extracts from said input symbol string alternating groups of serial symbols and produces therefrom a first parallel sequence of groups of parallel symbols, said second register means extracts from said input symbol string other alternating groups of serial symbols and produces therefrom a second parallel sequence of groups of parallel symbols, and said format means includes second multiplexing means connected to said first and second register means for interleaving said first and second parallel sequences to produce said second RLL symbol group sequence.

* * * * *